(12) United States Patent
Chen

(10) Patent No.: US 9,721,933 B2
(45) Date of Patent: Aug. 1, 2017

(54) LASER MARKING IN PACKAGES

(71) Applicant: Taiwan Semiconductor Manufacturing Company, Ltd., Hsin-Chu (TW)

(72) Inventor: Hsien-Wei Chen, Hsin-Chu (TW)

(73) Assignee: Taiwan Semiconductor Manufacturing Company, Ltd., Hsin-Chu (TW)

(*) Notice: Subject to any disclaimer, the term of this patent is extended or adjusted under 35 U.S.C. 154(b) by 0 days.

(21) Appl. No.: 15/361,861

(22) Filed: Nov. 28, 2016

(65) Prior Publication Data

US 2017/0077075 A1 Mar. 16, 2017

Related U.S. Application Data

(60) Continuation of application No. 15/155,267, filed on May 16, 2016, now Pat. No. 9,508,696, which is a (Continued)

(51) Int. Cl.
*H01L 21/44* (2006.01)
*H01L 25/10* (2006.01)
(Continued)

(52) U.S. Cl.
CPC ...... *H01L 25/105* (2013.01); *H01L 21/76898* (2013.01); *H01L 23/481* (2013.01); *H01L 23/544* (2013.01); *H01L 23/585* (2013.01); *H01L 24/06* (2013.01); *H01L 24/11* (2013.01); *H01L 24/17* (2013.01); *H01L 24/19* (2013.01); *H01L 24/20* (2013.01); *H01L 24/81* (2013.01); *H01L 25/0657* (2013.01); *H01L 25/50* (2013.01); *H01L 23/3128* (2013.01); *H01L 2223/54406* (2013.01); *H01L 2223/54433* (2013.01); *H01L 2223/54486* (2013.01); *H01L 2224/0401* (2013.01); *H01L 2224/04042* (2013.01); *H01L 2224/04105* (2013.01); *H01L 2224/05025* (2013.01); *H01L 2224/11334* (2013.01); *H01L 2224/11849* (2013.01);
(Continued)

(58) Field of Classification Search
CPC ... H01L 2224/3225; H01L 2224/73267; H01L 2224/8203; H01L 2224/04105; H01L 2224/24226; H01L 2224/92244; H01L 24/25; H01L 24/82; H01L 24/24
See application file for complete search history.

(56) References Cited

U.S. PATENT DOCUMENTS 6,423,908 B1 7/2002 Liu
7,053,495 B2 5/2006 Tsuura
(Continued)

FOREIGN PATENT DOCUMENTS

CN 101325188 A 12/2008
DE 10320646 A1 9/2004
(Continued)

*Primary Examiner* — (Vikki) Hoa B Trinh
(74) *Attorney, Agent, or Firm* — Slater Matsil, LLP

(57) ABSTRACT

A package includes a device die, a first plurality of redistribution lines underlying the device die, a second plurality of redistribution lines overlying the device die, and a metal pad in a same metal layer as the second plurality of redistribution lines. A laser mark is in a dielectric layer that is overlying the metal pad. The laser mark overlaps the metal pad.

20 Claims, 7 Drawing Sheets

Related U.S. Application Data division of application No. 14/192,341, filed on Feb. 27, 2014, now Pat. No. 9,343,434.

(51) Int. Cl.

| | | |
|---|---|---|
| *H01L 25/065* | (2006.01) | |
| *H01L 25/00* | (2006.01) | |
| *H01L 23/00* | (2006.01) | |
| *H01L 23/48* | (2006.01) | |
| *H01L 23/544* | (2006.01) | |
| *H01L 23/58* | (2006.01) | |
| *H01L 21/768* | (2006.01) | |
| *H01L 23/31* | (2006.01) | |

(52) U.S. Cl.
CPC ............. *H01L 2224/12105* (2013.01); *H01L 2224/16113* (2013.01); *H01L 2224/16145* (2013.01); *H01L 2224/32145* (2013.01); *H01L 2224/32225* (2013.01); *H01L 2224/48091* (2013.01); *H01L 2224/48227* (2013.01); *H01L 2224/73265* (2013.01); *H01L 2224/73267* (2013.01); *H01L 2224/81815* (2013.01); *H01L 2225/0651* (2013.01); *H01L 2225/06513* (2013.01); *H01L 2225/06548* (2013.01); *H01L 2225/06568* (2013.01); *H01L 2225/1035* (2013.01); *H01L 2225/1041* (2013.01); *H01L 2225/1058* (2013.01); *H01L 2225/1082* (2013.01); *H01L 2225/1094* (2013.01); *H01L 2924/00014* (2013.01); *H01L 2924/12042* (2013.01); *H01L 2924/15311* (2013.01); *H01L 2924/181* (2013.01)

(56) References Cited

U.S. PATENT DOCUMENTS

| | | |
|---|---|---|
| 7,795,717 B2 | 9/2010 | Goller |
| 8,178,964 B2 | 5/2012 | Yang |
| 8,563,403 B1 | 10/2013 | Farooq et al. |
| 2002/0048951 A1 | 4/2002 | Jeong et al. |
| 2003/0015342 A1 | 1/2003 | Sakamoto et al. |
| 2005/0104224 A1 | 5/2005 | Huang et al. |
| 2005/0161837 A1 | 7/2005 | Matsui |
| 2006/0202359 A1 | 9/2006 | Chen |
| 2007/0164432 A1 | 7/2007 | Wakisaka et al. |
| 2008/0121269 A1 | 5/2008 | Welser et al. |
| 2008/0284048 A1 | 11/2008 | Kim et al. |
| 2009/0045488 A1 | 2/2009 | Chang et al. |
| 2009/0236739 A1 | 9/2009 | Chen et al. |
| 2009/0302486 A1 | 12/2009 | Terashima et al. |
| 2010/0078655 A1 | 4/2010 | Yang |
| 2010/0144101 A1 | 6/2010 | Chow et al. |
| 2010/0171205 A1* | 7/2010 | Chen ............. H01L 21/565 257/686 |
| 2010/0187671 A1 | 7/2010 | Lin et al. |
| 2010/0233831 A1 | 9/2010 | Pohl et al. |
| 2010/0283138 A1 | 11/2010 | Chen et al. |
| 2010/0301474 A1 | 12/2010 | Yang |
| 2011/0147911 A1 | 6/2011 | Kohl et al. |
| 2011/0278736 A1 | 11/2011 | Lin et al. |
| 2011/0291249 A1 | 12/2011 | Chi et al. |
| 2012/0056315 A1 | 3/2012 | Chang et al. |
| 2012/0217645 A1 | 8/2012 | Pagaila |
| 2012/0247291 A1 | 10/2012 | Kawada |
| 2014/0057394 A1 | 2/2014 | Ramasamy et al. |
| 2014/0110858 A1 | 4/2014 | Beer et al. |
| 2014/0264846 A1 | 9/2014 | Chen et al. |
| 2015/0340308 A1* | 11/2015 | Law ............. H01L 23/49811 257/690 |

FOREIGN PATENT DOCUMENTS

| | | |
|---|---|---|
| JP | 3670634 B2 | 7/2005 |
| JP | 2005217071 A | 8/2005 |
| KR | 20000002908 A | 1/2000 |
| KR | 20070051038 A | 5/2007 |
| KR | 100878933 B1 | 1/2009 |
| KR | 20120024350 A | 3/2012 |

* cited by examiner

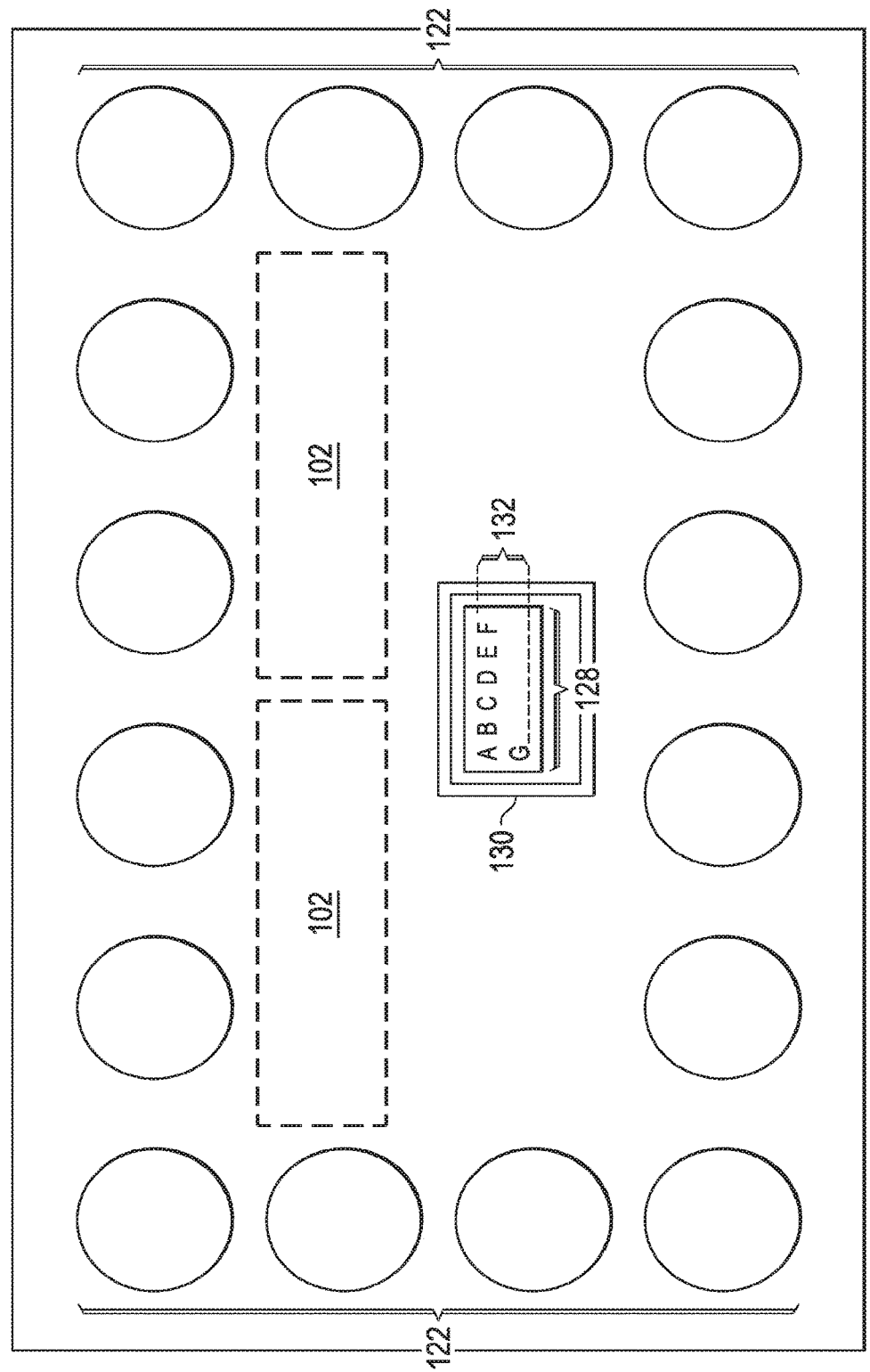

LASER MARKING IN PACKAGES

PRIORITY CLAIM AND CROSS-REFERENCE

This application is a continuation of U.S. patent application Ser. No. 15/155,267, entitled "Laser Marking in Packages," filed on May 16, 2016, which application is a divisional of U.S. patent application Ser. No. 14/192,341, entitled "Laser Marking in Packages," filed on Feb. 27, 2014, now U.S. Pat. No. 9,343,434, issued May 17, 2016, which applications are incorporated herein by reference.

BACKGROUND

In the packaging of integrated circuits, there are various types of packaging methods and structures. For example, in a conventional Package-on-Package (POP) process, a top package is bonded to a bottom package. The top package and the bottom package may also have device dies packaged therein. By adopting the PoP process, the integration level of the packages is increased.

In an existing PoP process, the bottom package is formed first, which includes a device die bonded to a package substrate. A molding compound is molded on the package substrate, wherein the device die is molded in the molding compound. The package substrate further includes solder balls formed thereon, wherein the solder balls and the device die are on a same side of the package substrate. The solder balls are used for connecting the top package to the bottom package.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 7 illustrates a top view of a package in accordance with some embodiments, wherein a laser mark and a respective metal pad are misaligned with device dies in the package.

DETAILED DESCRIPTION

Figure 1:
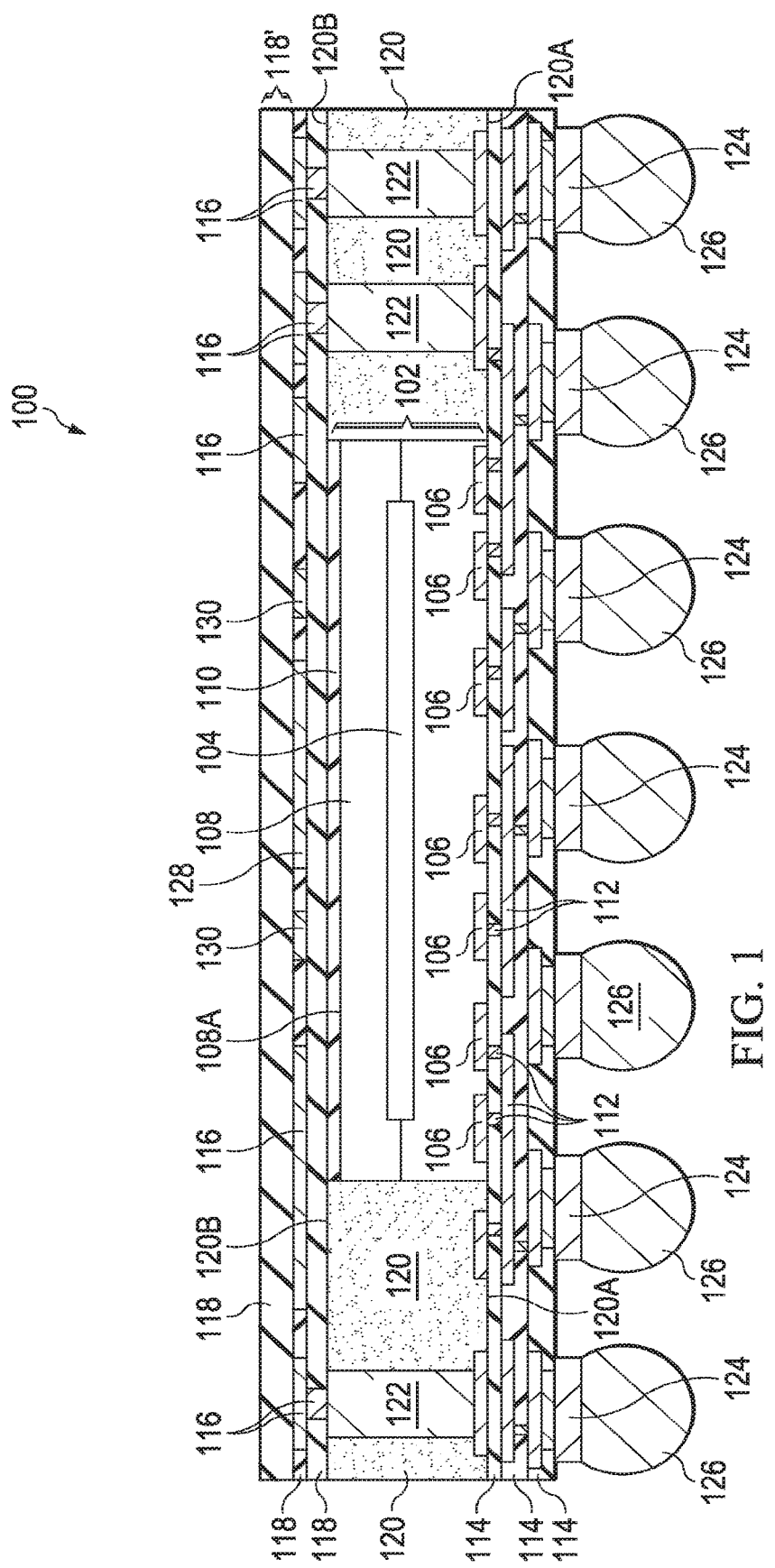
FIGS. 1 through 5 illustrate the cross-sectional views of intermediate stages in the formation of a package in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "underlying," "below," "lower," "overlying," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A package and the method of forming laser marks in the package are provided in accordance with various exemplary embodiments. The variations of the embodiments are discussed. Throughout the various views and illustrative embodiments, like reference numbers are used to designate like elements.

FIG. 1 illustrates a cross-sectional view of package 100. In some embodiments, package 100 includes device die 102, with the front side of device die 102 facing down and bonded to Redistribution Lines (RDLs) 112. In alternative embodiments, package 100 includes more than one device die. Device die 102 may include semiconductor substrate 108, and integrated circuit devices 104 (such as active devices, which include transistors, for example) at the front surface (the surface facing down) of semiconductor substrate 108. Device die 102 may include a logic die such as a Central Processing Unit (CPU) die, a Graphic Processing Unit (GPU) die, a mobile application die, or the like.

Device die 102 is molded in molding material 120, which surrounds device die 102. Molding material 120 may be a molding compound, a molding underfill, a resin, or the like. The bottom surface 120A of molding material 120 may be leveled with the bottom ends of device dies 102. The top surface 120B of molding material 120 may be level with or higher than back surface 108A of semiconductor substrate 108. In some embodiments, back surface 108A of semiconductor substrate 108 is overlapped by die-attach film 110, which is a dielectric film adhering device die 102 to the overlying dielectric layer 118. Device die 102 further includes metal pillars/pads 106 (which may include copper pillars, for example) in contact with, and bonded to, RDLs 112.

Package 100 may include bottom-side RDLs 112 underlying device die 102, and top-side RDLs 116 overlying device dies 102. Bottom-side RDLs 112 are formed in dielectric layers 114, and top-side RDLs 116 are formed in dielectric layers 118. RDLs 112 and 116 may be formed of copper, aluminum, nickel, titanium, alloys thereof, or multi-layers thereof. In some embodiments, dielectric layers 114 and 118 are formed of organic materials such as polymers, which may further include polybenzoxazole (PBO), benzocyclobutene (BCB), polyimide, or the like. In alternative embodiments, dielectric layers 114 and 118 are formed of inorganic material such as silicon oxide, silicon nitride, silicon oxynitride, or the like.

Through-Vias 122 are formed to penetrate through molding material 120. In some embodiments, through-vias 122 have top surfaces level with the top surface 120B of molding material 120, and bottom surfaces level with the bottom surface 120A of molding material 120. Through-Vias 122 electrically connect bottom-side RDLs 112 to top-side RDLs 116. Through-Vias 122 may also be in physical contact with bottom-side RDLs 112 and top-side RDLs 116.

Electrical connectors 124, which are formed of a non-solder metallic material(s), are formed at the bottom surface of package 100. In some embodiments, electrical connectors 124 include Under-Bump Metallurgies or metal pads. In alternative embodiments, electrical connectors 124 include metal pillars such as copper pillars. Throughout the description, electrical connectors 124 are referred to as metal pads 124, although they may have other forms. In accordance with some embodiments, metal pads 124 comprise copper, aluminum, titanium, nickel, palladium, gold, or multi-layers thereof. In some embodiments, as shown in FIG. 1, the bottom surfaces of metal pads 124 are level with the bottom surface of the bottom dielectric layer 114. In alternative embodiments, the bottom surfaces of metal pads 124 extend below the bottom surface of the bottom dielectric layer 114. In some embodiments, solder regions 126 are attached to the bottom surfaces of metal pads 124.

Metal pad 128 is formed in one of metal layers in which RDLs 116 are formed. In some embodiments, metal pad 128 is electrically floating. In alternative embodiments, metal pad 128 is electrically connected to other conductive features such as RDLs 116 and/or through-vias 122. For example, metal pad 128 may be connected to the electrical ground. Metal pad 128 is formed simultaneously when the respective RDLs 116 in the same metal layer are formed.

Figure 6:
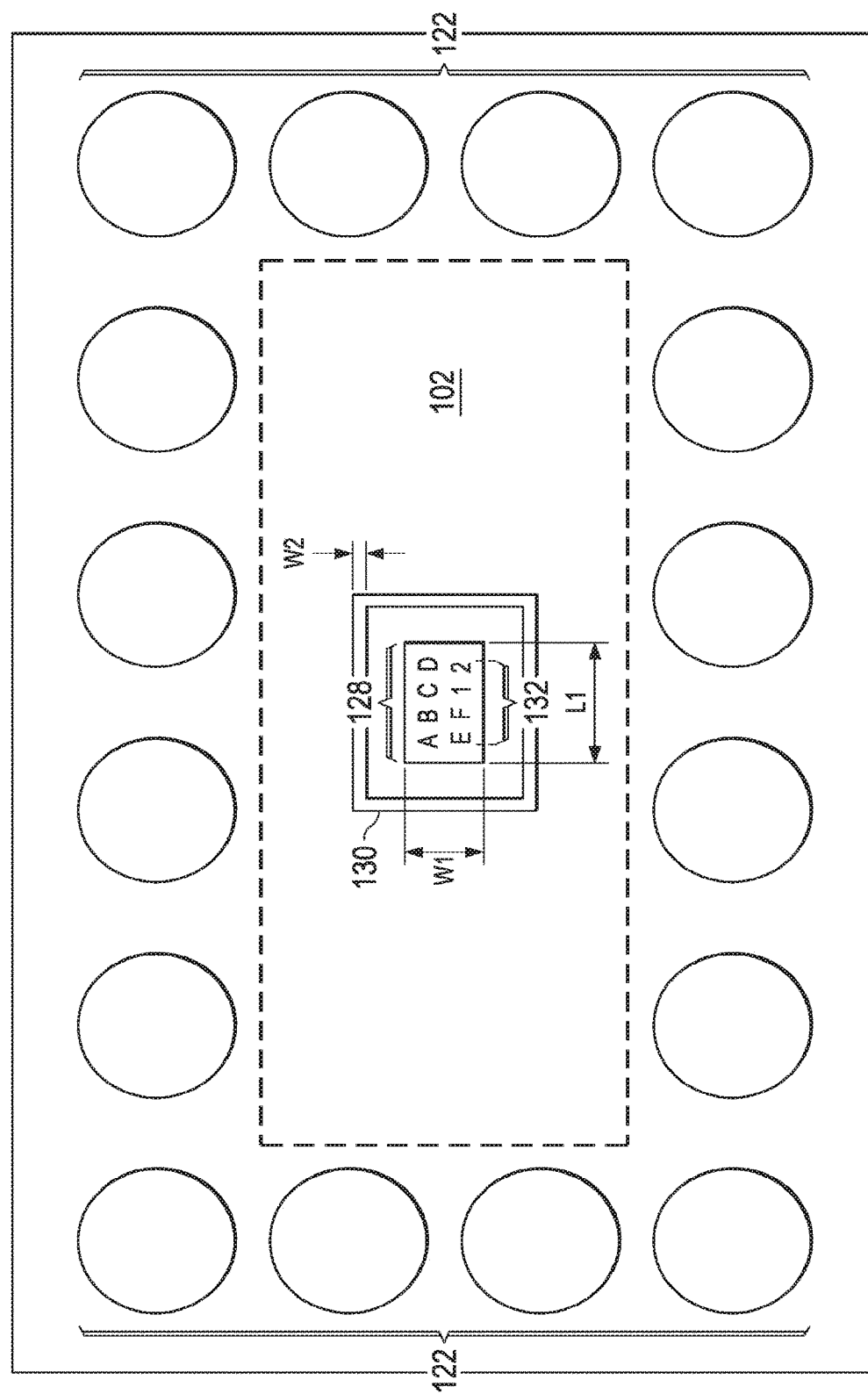
FIG. 6 illustrates a top view of a package in accordance with some embodiments, wherein a laser mark and a respective metal pad are formed overlapping a device die in the package.

In some exemplary embodiments, seal ring 130 is formed to encircle metal pad 128, wherein the exemplary seal ring 130 may be found in FIGS. 6 and 7. As shown in FIG. 1, seal ring 130 is formed in the same metal layer as metal pad 128. In some embodiments, seal ring 130 is electrically floating, and may be fully enclosed by dielectric materials. In alternative embodiments, seal ring 130 is electrically coupled to other conductive features such as RDLs 116 and/or through-vias 122. Seal ring 130 is formed simultaneously when metal pad 128 is formed. In alternative embodiments, no seal ring is formed to encircle metal pad 128.

In accordance with some embodiments, the bottom surfaces of metal pad 128 and seal ring 130 are higher than the top surface of die-attach film 110 and the top surface 120B of molding material 120. One of dielectric layers 118 is formed underneath metal pad 128 and seal ring 130, with the top surface of the respective dielectric layer 118 contacting the bottom surfaces of metal pad 128 and seal ring 130. Overlying metal pad 128 and seal ring 130, there exists an additional layer, which is one of dielectric layers 118, and is marked as 118'.

Figure 2:
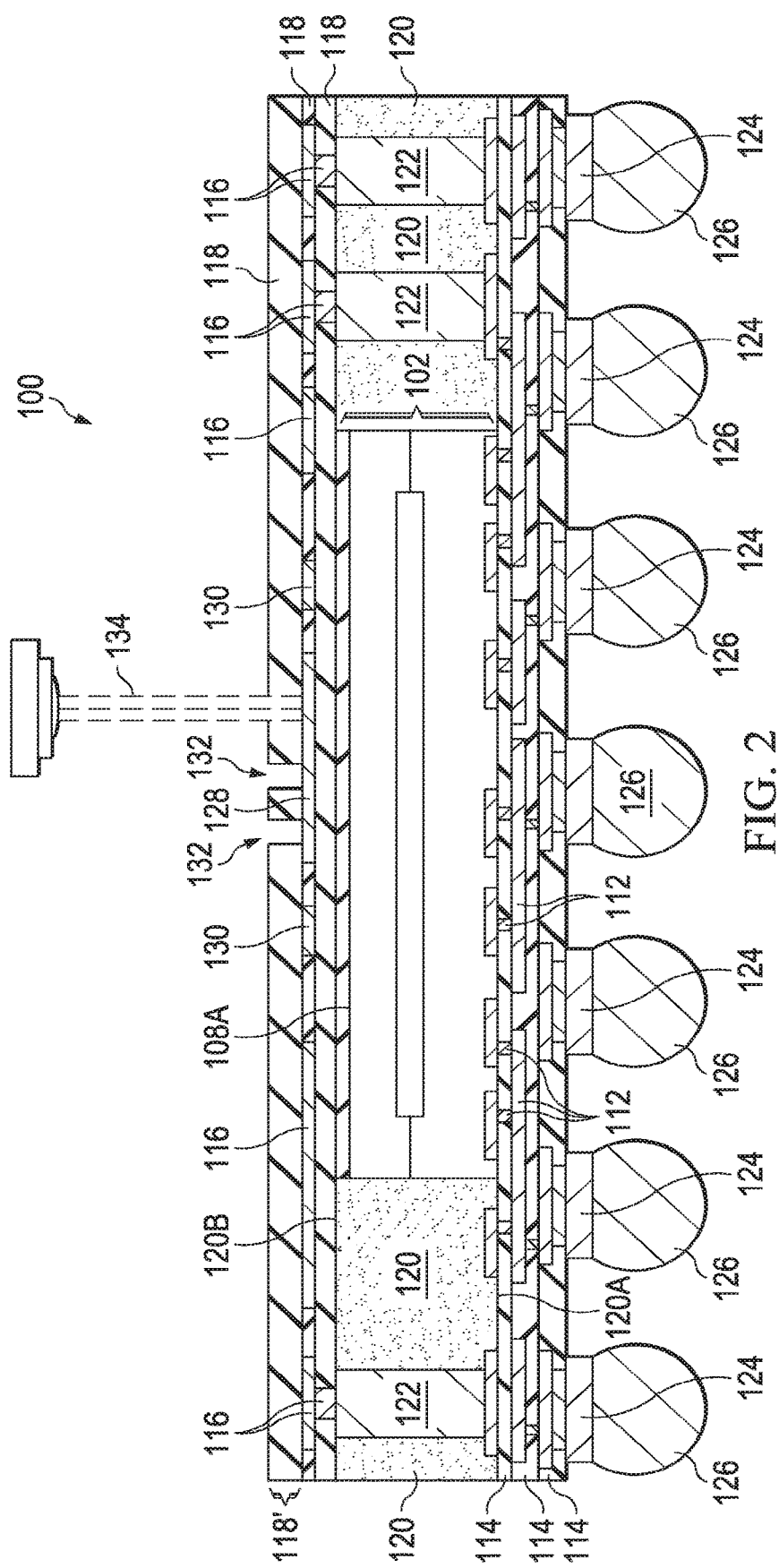

Referring to FIG. 2, a laser marking is performed to form laser marks 132 in dielectric layer 118', wherein laser marks 132 include the trenches formed in dielectric layer 118'. The laser marking is performed using laser beam 134, which burns and removes parts of dielectric layer 118'. The burned parts of dielectric layer 118' overlap metal pad 128. Metal pad 128 acts as a protection layer, wherein laser beam 134 is not able to penetrate through metal pad 128. Hence, metal pad 128 has the function of preventing laser beam 134 from reaching the underlying device die 102 and the underlying RDLs 116, if any. After the laser marking, some portions of metal pads 128 are exposed through the trenches that form laser marks 132. Laser marks 132 may include letters, digits, figures, or any other symbols that can be used for identification purpose. For example, FIGS. 6 and 7 illustrate some exemplary laser marks 134 that include letters and digits. Laser marks 132 may be used to identify the product, the manufacturing sequence, or any other information that is used to track the respective package.

Figure 3:
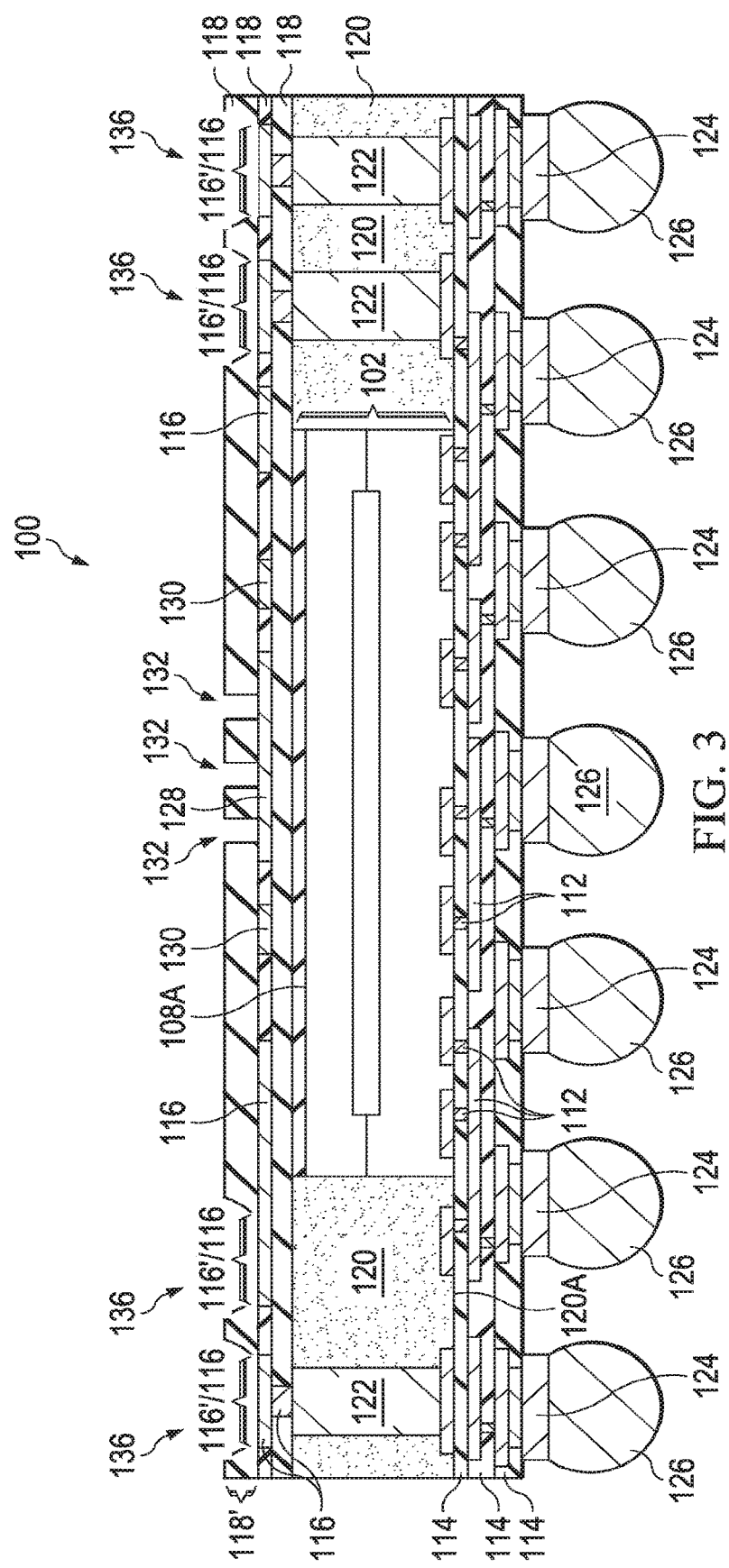

FIG. 3 illustrates the removal of some parts of dielectric layers 118 to expose metal pads 116', which may be parts of RDLs 116. As a result, openings 136 are formed in dielectric layers 118'. The formation of openings 136 may be achieved through laser burning. Alternatively, when dielectric layer 118' is formed of a light-sensitive material such as PBO or polyimide, the formation of openings 136 may be achieved through a light-exposure followed by a development step.

Figure 4:
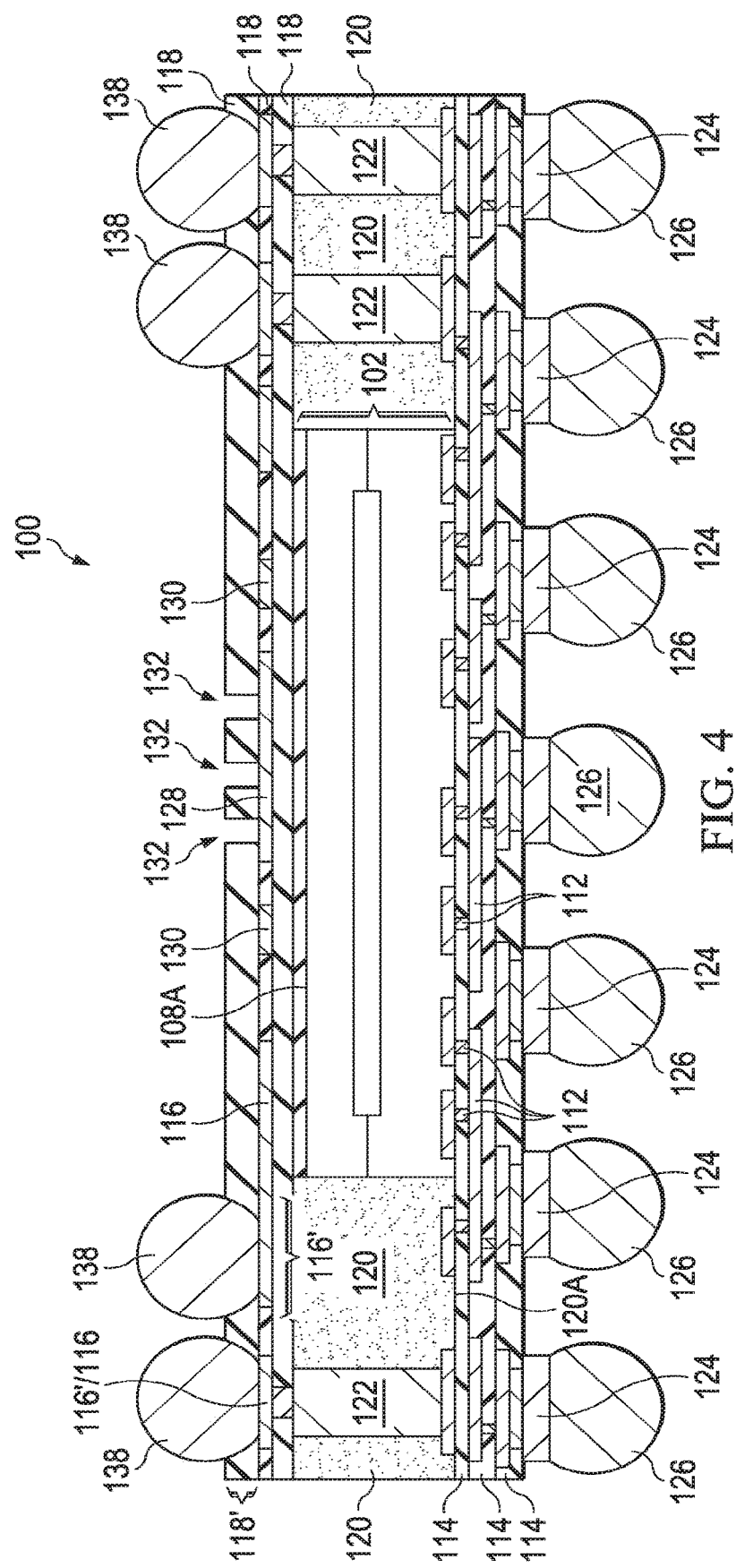

FIG. 4 illustrates the formation of solder balls 138. In some embodiments, a ball placement step is performed to drop solder balls in openings 136 (FIG. 3), followed by a reflow process to reflow the solder balls. In alternative embodiments, no solder ball is applied in openings 136. Rather, the solder is in package 200 as in FIG. 5.

Figure 5:
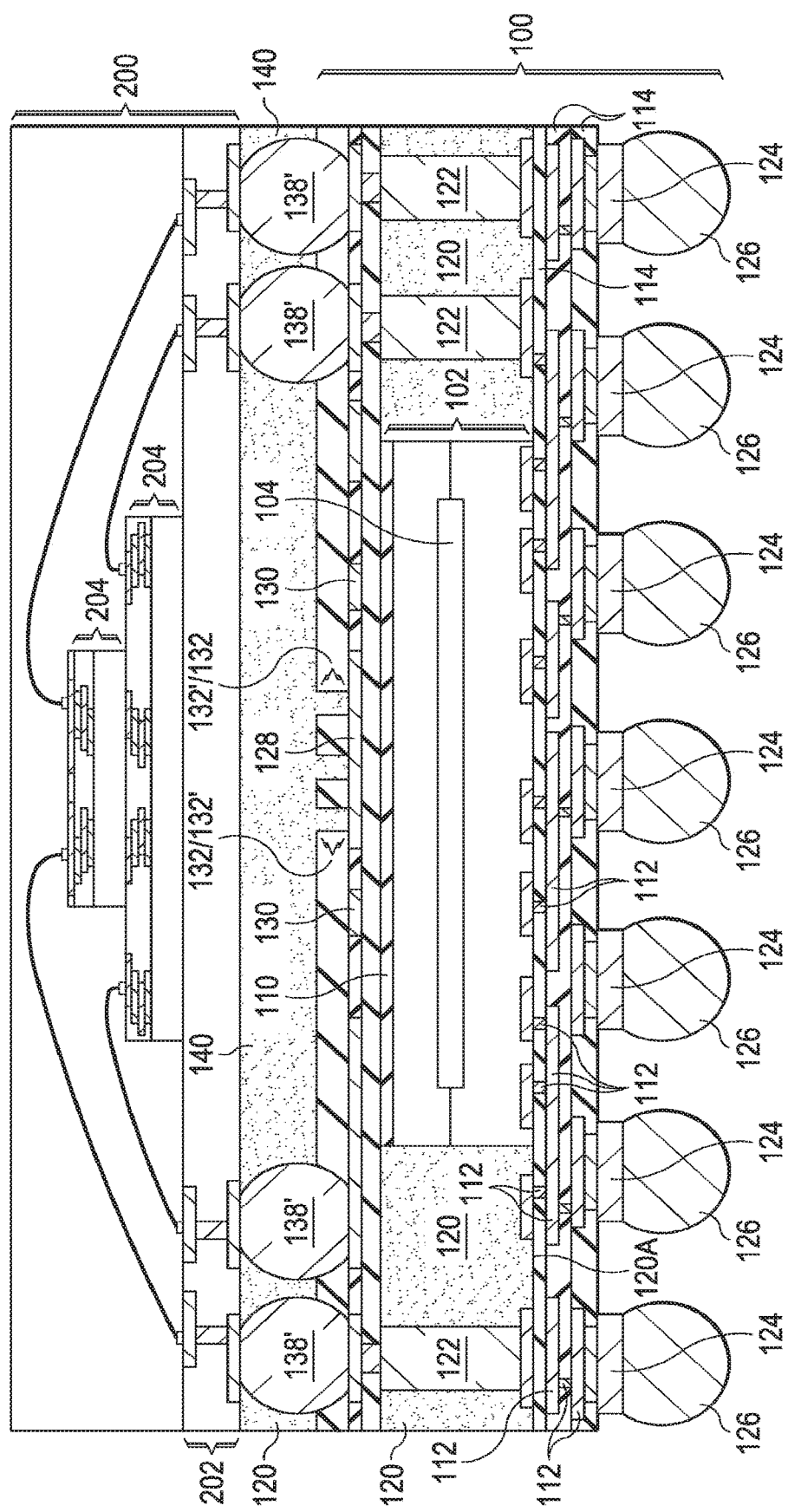

FIG. 5 illustrates the bonding of package 200 with package 100. In some embodiments, package 200 includes package substrate 202, and device die(s) 204 bonded to package substrate 202. The bonding of device dies 204 to package substrate 202 may be achieved through wire bonding, flip-chip bonding, or the like. Solder regions 138 as shown in FIG. 4 are reflowed to bond package 200 to package 100. In some embodiments, after the bonding of package 200, underfill 140 is filled into the gap between package 100 and package 200. In these embodiments, the trenches of laser mark 132 (FIG. 4) are also filled with underfill 140. Accordingly, the portions of underfill 140 in the trenches of the laser mark 132 are referred to as laser marks 132'. Laser marks 132' may extend from the top surface of dielectric layer 118' to the top surface of metal pad 128. Furthermore, laser marks 132' may be in physical contact with the top surface of metal pad 128.

In the package as shown in FIG. 5, metal pad 128 may be fully enclosed by, and in contact with, dielectric materials including dielectric layers 118 and underfill 140. In alternative embodiments, no underfill is filled into the gap between package 100 and package 200, and laser marks 132 remain to be air gaps. In these embodiments, some portions of metal pad 128 may be exposed to air through laser marks 132.

FIG. 6 illustrates a top view of package 100 in accordance with some embodiments. As shown in FIG. 6, laser marks 132 are formed to overlap metal pad 128, wherein all laser marks 132 are formed on metal pad 128 or other metal pads. Seal ring 130 is formed in some embodiments, and forms a ring encircling metal pad 128. In some exemplary embodiments, the length L1 and width W1 of metal pad 128 are greater than about 2 cm to allow an adequate area for forming laser marks 132. Seal ring 130 is formed to prevent the heat generated during the laser marking from being propagated to other regions.

During the laser marking, heat is generated, and may damage the structures including RDLs and dielectric layers. To reduce or at least eliminate the damage caused by the heat, seal ring 130 may have a greater width W2, for example, greater than about 20 μm to provide a low thermal resistivity, so that an overheated portion of seal ring 130 may quickly dissipate the heat to other portions of seal ring 130. In alternative embodiments, no seal ring 130 is formed.

In the embodiments as shown in FIG. 6, through-vias 122 may be formed close to the peripheral of package 100, although through-vias 122 may also be formed in any other locations of package 100. Through-vias 122 may be aligned to a ring that encircles metal pad 128 in some embodiments.

In FIG. 6, metal pad 128 and laser marks 132 are formed directly over, and overlap, die 102. In alternative embodiments, as shown in FIG. 7, which also illustrates a top view of package 100, metal pad 128 and laser marks 132 are not aligned to device die 102. This embodiment may be used when there is enough space for allocating metal pad 128.

The embodiments of the present disclosure have several advantageous features. By forming metal pads, the device dies and the redistribution lines in the packages are protected from the likely damage caused by the laser marking. The embodiments of the present disclosure do not incur additional manufacturing cost since the metal pads may be formed at the same time the redistribution lines of the package are formed.

In accordance with some embodiments of the present disclosure, a package includes a device die, a first plurality of redistribution lines underlying the device die, a second plurality of redistribution lines overlying the device die, and a metal pad in a same metal layer as the second plurality of redistribution lines. A laser mark is in a dielectric layer that is overlying the metal pad. The laser mark overlaps the metal pad.

In accordance with alternative embodiments of the present disclosure, a first package includes at least one first dielectric layer, a first plurality of redistribution lines in the at least one first dielectric layer, a device die over and electrically coupled to the first plurality of redistribution lines, a molding material molding the device die therein, a through-via penetrating through the molding material, at least one second dielectric layer over the device die, and a second plurality of redistribution lines in the at least one second dielectric layer. The second plurality of redistribution lines is electrically coupled to the first plurality of redistribution lines through the through-via. The first package further includes a metal pad in the at least one second dielectric layer, a third dielectric layer overlying the at least one second dielectric layer, and a laser mark extending from a top surface of the third dielectric layer to a top surface of the metal pad. A second package is over the first package, wherein the second package is bonded to the first package.

In accordance with yet alternative embodiments of the present disclosure, a method includes performing a laser marking on a package. The package includes at least one first dielectric layer, a first plurality of redistribution lines in the at least one first dielectric layer, a device die over and electrically coupled to the first plurality of redistribution lines, a molding material molding the device die therein, a through-via penetrating through the molding material, at least one second dielectric layer over the device die, a second plurality of redistribution lines in the at least one second dielectric layer, wherein the second plurality of redistribution lines is electrically coupled to the first plurality of redistribution lines through the through-via, a metal pad in the at least one second dielectric layer. The package further includes a third dielectric layer overlying the at least one second dielectric layer. The laser marking forms a laser mark in the third dielectric layer, with portions of the metal pad exposed to the laser mark.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
   encapsulating a device die in an encapsulating material;
   forming a first dielectric layer over and contacting the device die and the encapsulating material;
   forming a second dielectric layer over the first dielectric layer;
   forming a metal pad in the second dielectric layer;
   forming a third dielectric layer covering the metal pad;
   performing a laser marking to form an opening in the third dielectric layer, wherein a portion of the metal pad is exposed to the opening, and the opening has a pattern selected from the group consisting of letters and digits; and
   filling the opening with a dielectric material.

2. The method of claim 1 further comprising:
   bonding a package over the third dielectric layer; and
   filling an underfill into a gap between the package and the third dielectric layer, wherein the underfill fills an entirety of the opening.

3. The method of claim 2, wherein the underfill is in physical contact with the metal pad.

4. The method of claim 1 further comprising:
   forming additional openings in the third dielectric layer to expose a plurality of additional metal pads in the second dielectric layer;
   disposing solder regions in the additional openings, wherein no solder region is disposed into the opening; and
   reflowing the solder regions to connect the solder regions with the plurality of additional metal pads.

5. The method of claim 1, wherein in the laser marking, the metal pad stops a laser beam used for forming the opening.

6. The method of claim 1 further comprising, when the metal pad is formed, simultaneously forming a seal ring encircling the metal pad.

7. The method of claim 1 further comprising:
   encapsulating a metal post in the encapsulating material; and
   forming a redistribution line in the second dielectric layer, with the redistribution line electrically connecting the metal pad to the metal post.

8. The method of claim 1 further comprising electrically grounding the metal pad.

9. The method of claim 1, wherein the metal pad is electrically floating.

10. A method comprising:
    encapsulating a device die and a metal post in an encapsulating material;
    forming a first metal pad over the device die, wherein the first metal pad is electrically coupled to the metal post;
    forming a second metal pad over the device die, wherein the first metal pad and the second metal pad are formed in a common formation process;
    forming a dielectric layer to cover the first metal pad and the second metal pad;
    forming a first opening and a second opening in the dielectric layer to reveal the first metal pad and the second metal pad, respectively;
    filling the first opening with a solder region; and
    filling the second opening with a dielectric material.

11. The method of claim 10 further comprising:
    bonding a package, wherein the package is electrically coupled to the solder region, wherein the second opening is filled after the bonding, and the filling the second opening comprises filling an underfill into the second opening.

12. The method of claim 11, wherein an entirety of the second opening is filled with the underfill.

13. The method of claim 10, wherein both the first opening and the second opening are formed through laser drilling.

14. The method of claim 10 further comprising:
encapsulating an additional metal post in the encapsulating material; and
forming a redistribution line to electrically connect the second metal pad to the additional metal post.

15. The method of claim 10, wherein the first metal pad is electrically floating.

16. A method comprising:
encapsulating a device die and a metal post in an encapsulating material;
forming a first metal pad over the device die, wherein the first metal pad is electrically coupled to the metal post;
forming a second metal pad over the device die;
forming a dielectric layer to cover the first metal pad and the second metal pad;
forming an opening in the dielectric layer to expose the first metal pad;
forming a plurality of additional openings in the dielectric layer to expose the second metal pad, wherein the plurality of additional openings is separated from each other;
filling the opening with a solder region; and
reflowing the solder region, wherein when the solder region is reflowed, the plurality of additional openings is not filled with solder regions.

17. The method of claim 16 further comprising filling the plurality of additional openings with an underfill.

18. The method of claim 16, wherein the plurality of additional openings has patterns of letters, digits, and combinations thereof.

19. The method of claim 16, wherein both the opening and the plurality of additional openings are formed through laser drilling.

20. The method of claim 16, wherein the first metal pad is electrically floating.

* * * * *